(12) United States Patent
Li (10) Patent No.: US 9,960,760 B2
(45) Date of Patent: May 1, 2018

(54) MULTI-LEVEL OUTPUT CASCODE POWER STAGE

(71) Applicant: Analog Devices Global, Hamilton (BM)

(72) Inventor: Dan Li, Shanghai (CN)

(73) Assignee: Analog Devices Global, Hamilton (BM)

( * ) Notice: Subject to any disclaimer, the term of this patent is extended or adjusted under 35 U.S.C. 154(b) by 1079 days.

(21) Appl. No.: 14/063,636

(22) Filed: Oct. 25, 2013

(65) Prior Publication Data

US 2015/0028681 A1    Jan. 29, 2015

Related U.S. Application Data

(60) Provisional application No. 61/858,477, filed on Jul. 25, 2013.

(51) Int. Cl.
*H03K 17/00* (2006.01)
*H03K 17/081* (2006.01)
*H03F 1/22* (2006.01)

(52) U.S. Cl.
CPC ....... *H03K 17/08104* (2013.01); *H03F 1/223* (2013.01); *Y10T 307/696* (2015.04)

(58) Field of Classification Search
CPC .............................................. H03K 17/08104
See application file for complete search history.

(56) References Cited

U.S. PATENT DOCUMENTS 5,210,503 A * 5/1993 Sawamura ............. H03G 11/02
                                                      327/330
6,064,264 A * 5/2000 Tarsia ....................... H03F 3/72
                                                      330/277

(Continued)

FOREIGN PATENT DOCUMENTS

CN        101124713 A       2/2008
CN        101335504 A      12/2008

(Continued)

OTHER PUBLICATIONS

"Chinese Application Serial No. 201410357377.2, Office Action dated Nov. 30, 2016", Without English Translation, 13 pgs.

(Continued)

*Primary Examiner* — Jared Fureman
*Assistant Examiner* — Joel Barnett
(74) *Attorney, Agent, or Firm* — Schwegman Lundberg & Woessner, P.A.

(57) ABSTRACT

A power stage to generate an output voltage at one of a high reference voltage, an intermediate reference voltage and a low reference voltage, including a first switch stage connecting the output terminal to the high reference voltage, comprising a pair of transistors connected in series along their source-to-drain paths, a first transistor coupled to the output terminal and having its gate biased at the intermediate voltage, a second transistor having a gate that receives a first stage control signal that varies between the high reference voltage and the intermediate reference voltage, a second switch stage connecting the output terminal to the intermediate reference voltage, having a gate that receives a second stage control signal that varies among the high reference voltage, intermediate reference voltage and low reference voltage, a third switch stage connecting the output terminal to the low reference voltage, having a pair of transistors connected in series along their source-to-drain paths, a first (Continued)

transistor coupled to the output terminal and having its gate biased at the intermediate voltage, a second transistor having a gate that receives a third stage control signal that varies between the intermediate reference voltage and the low reference voltage.

20 Claims, 6 Drawing Sheets

(56) References Cited

U.S. PATENT DOCUMENTS

| | | | |
|---|---|---|---|
| 7,449,868 B2 | 11/2008 | Elbanhawy | |
| 8,405,459 B2* | 3/2013 | Maruyama | H03F 3/45192 330/255 |
| 2006/0220735 A1 | 10/2006 | Honda | |
| 2012/0025911 A1* | 2/2012 | Zhao | H03F 1/223 330/254 |
| 2012/0153727 A1* | 6/2012 | Takano | H02M 7/483 307/75 |
| 2014/0176242 A1* | 6/2014 | Lin | H03H 7/38 330/277 |

FOREIGN PATENT DOCUMENTS

| | | |
|---|---|---|
| CN | 101841226 A | 9/2010 |
| CN | 102270979 A | 12/2011 |
| CN | 102648576 A | 8/2012 |
| CN | 104348435 A | 2/2015 |
| WO | WO-2008047323 A1 | 4/2008 |

OTHER PUBLICATIONS

Berkhout, M., "A 460W Class-D Output Stage with Adaptive Gate Drive", 2009 IEEE International Solid-State Circuits Conference, Digest of Technical Papers, (Feb. 2009), 3 pgs.

Siniscalchi, Patrick P., et al., "A 20W/Channel Class-D Amplifier With Near-Zero Common-Mode Radiated Emissions", IEEE Journal of Solid-State Circuits, 44(12), (Dec. 2009), 3264-3271.

"Chinese Application Serial No. 201410357377.2, Office Action dated Nov. 1, 2017", 10 pgs.

* cited by examiner

MULTI-LEVEL OUTPUT CASCODE POWER STAGE

This application claims the benefit of U.S. Provisional Patent Application No. 61/858,477 filed on Jul. 25, 2013, which is incorporated herein by reference.

BACKGROUND

In recent years, specialized semiconductor process technologies have emerged for specific applications. Once such process is the Bipolar CMOS DMOS (BCD) process technology, which integrates semiconductor components manufactured according to a variety of process technologies (e.g., bipolar processes, CMOS processes and DMOS processes). The cost to manufacture integrated circuits according to BCD processes typically is substantially higher than to manufacture integrated circuits according to single process types (e.g., only bipolar processes, only CMOS processes or only DMOS process type). However, the costs to manufacture a circuit system as a single integrated circuit according to a BCD process can be commensurate with the cost to manufacture the same circuit system as three integrated circuits, each according to a single process type, and therefore BCD designs are attractive for various system designs.

Many system designs require an integrated circuit to handle voltages that, if misused, can damage the semiconductor components therein and render the integrated circuit unusable. Taking one example, an integrated circuit may be manufactured according to a process technology that can handle only 5V but some circuit components may be required to handle voltages at high levels such as 6-8V. Typical examples include power switching systems, which may drive components external to the integrated circuit. While some circuit designs have been developed to accommodate excess voltages (for example, a cascode configuration may enable a 5V device to function using a higher power supply voltage) such devices are still seldom used in such applications because the current through the power stages may be high and may cause damage to the switching elements. Another drawback of the prior configurations is the increased complexity and sensitivity of the power stage driver design. Due to the high cost of integrated circuits manufactured according to BCD processes, these risks are particularly acute because damage to a semiconductor component in BCD integrated circuits incurs a commensurately high replacement cost.

Accordingly, the inventor has identified a need for a cascode configuration that can be used in any process in which low voltage devices can be used sustain high voltage. For example, an improved Class D amplifier having increased power efficiency, less stress on amplifier components, and better EMI and SNR performance is provided.

DETAILED DESCRIPTION

In general, power stages output two voltage levels. Embodiments of the present invention are directed to a multi-level output cascode power stage. The multi-level output cascode may be adapted to many portable systems, such as an amplifier system, including a power stage having inputs for at least three supply voltages and an output voltage node for coupling to a load, the power stage including a first plurality of transistors, at least one of the first plurality of transistors being disposed between an intermediate voltage node and the output voltage node, and at least two of the first plurality of transistors being connected in series and disposed between a high voltage node and the output voltage node, a second plurality of transistors being connected in series and disposed between the output voltage node and ground, and a driver to generate control signals to the power stage that causes the power stage to vary an output voltage applied to the load from among the at least three voltage levels. The cascode power stage according to an embodiment outputs three voltage levels including high voltage VHI, intermediate voltage VMED, and a low voltage VLO, such as ground.

Figure 1:
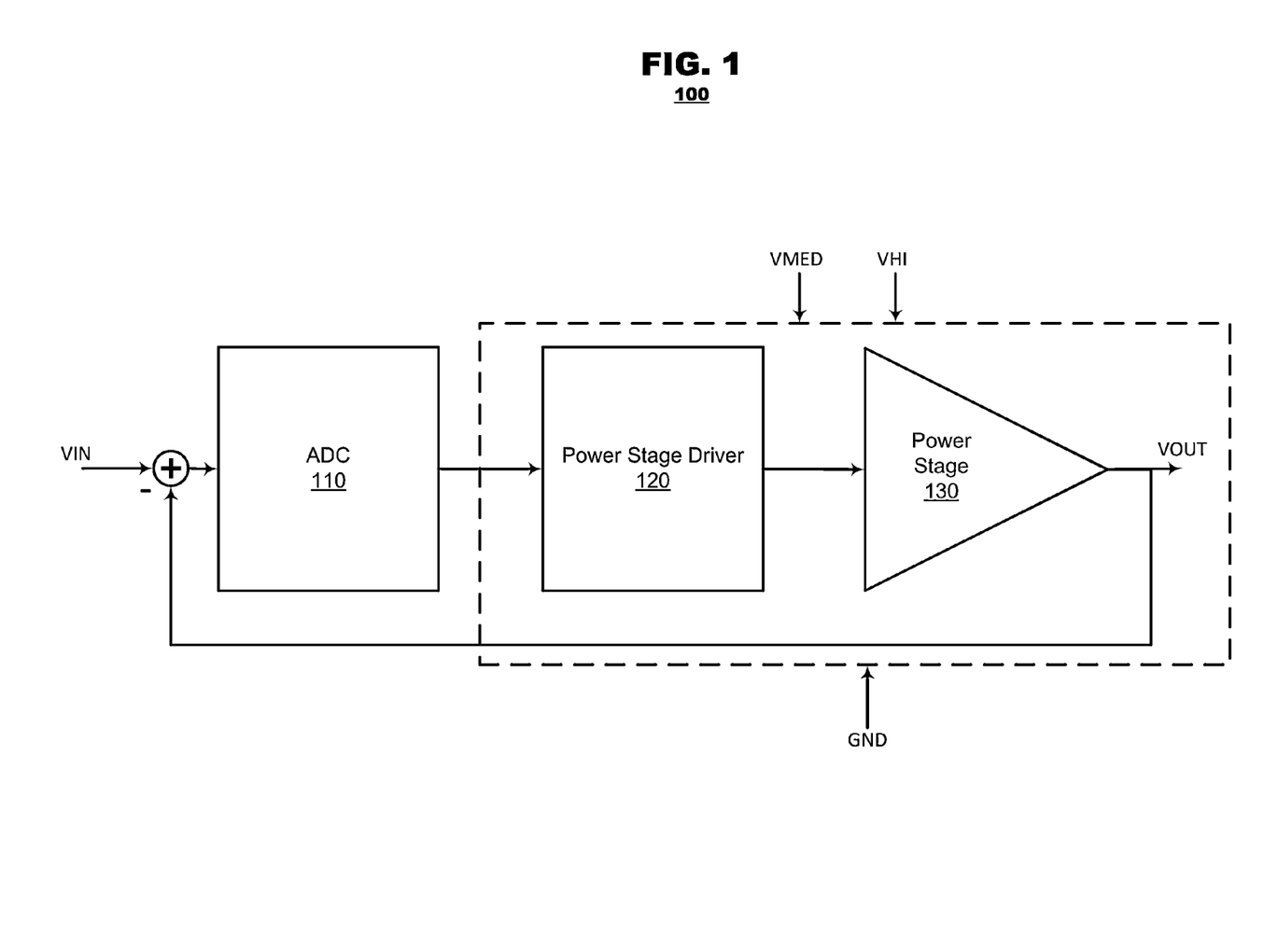
FIG. 1 illustrates a system diagram of a multi-level amplifier according to an example embodiment.

FIG. 1 illustrates a system diagram of a multi-level amplifier 100 according to an embodiment of the present invention. As shown in FIG. 1, the amplifier circuit 100 may include an analog-to-digital converter (ADC) 110, power stage driver 120, and power stage 130. The ADC 110, power stage driver 120, and power stage 130 may be coupled to input voltage VMED, such as a battery supplied voltage. Power stage driver 120 and power stage 130 also may be coupled to high voltage supply VHI. Although VMED and VHI are not fixed voltages, VHI is typically higher than VMED.

The amplifier circuit 100 may include an ADC circuit 110, power stage driver 120, and power stage 130. In advance of supplying the input signal VIN to the ADC circuit 110, a mixer integrates the input signal VIN with the output signal VOUT produced by power stage 130. The output signal VOUT is supplied to the mixer by a feedback loop.

The ADC circuit 110 can use one of several architectures, such as a flash, delta-sigma, pipelined, and successive approximation register (SAR) architectures. When the ADC circuit 110 may implement with delta-sigma architecture, the ADC circuit 110 generally includes an integrator (not shown) that outputs to a quantizer (not shown). The resulting signal of the quantizer may then be supplied to the power stage driver 120.

The power stage driver 120 receives comparison signals signal from quantizer of ADC circuit 110 to generate a plurality of gate control signals that control the switching elements of power stage 130. The example power stage 130 may include a plurality of switching elements arranged in an H-bridge configuration.

Figure 2:
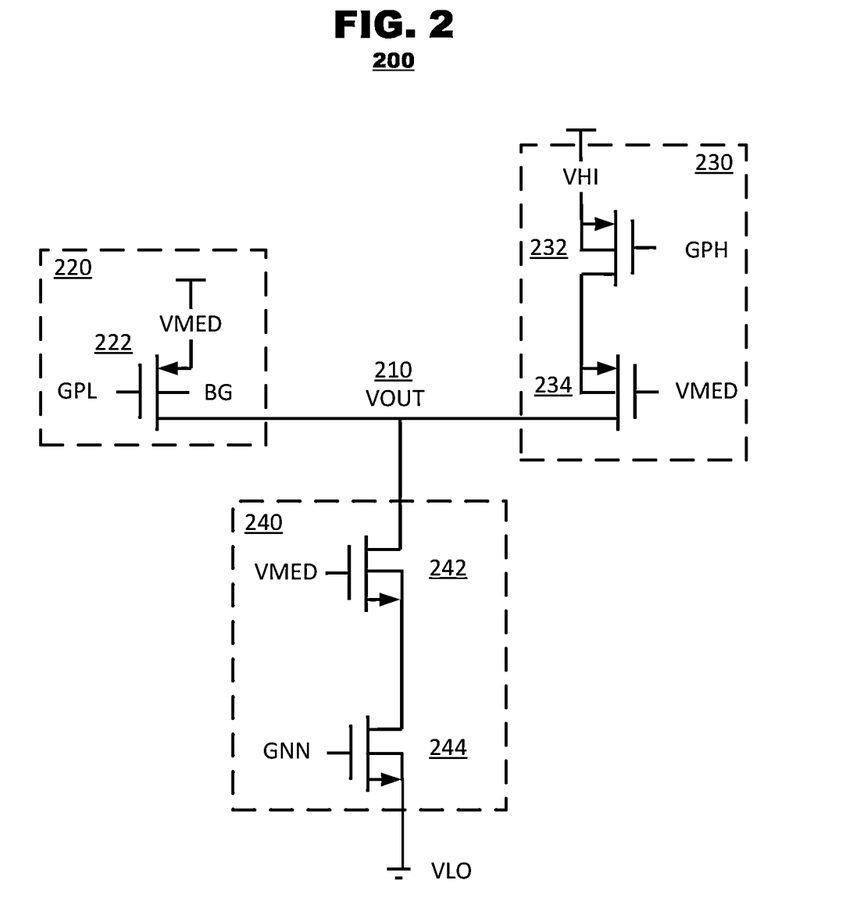
FIG. 2 illustrates a cascode power stage according to an example embodiment of the present invention.

FIG. 2 illustrates a cascode power stage 200 according to an example embodiment of the present invention. The power stage 200 may include an output terminal 210 connected to supply voltages by three different circuit paths 220, 230 and 240. A first circuit path 220 connects the output terminal to an intermediate supply voltage (shown as "VMED") by a single transistor 222. A second circuit path 230 may connect the output terminal 210 to a high supply voltage (shown as "VHI") by a pair of transistors 232, 234. A third circuit 240 path may connect the output terminal 210 to a low supply voltage VLO (shown as ground) by another pair of transistors 242, 244. The power stage may be controlled to generate an output voltage on the output terminal 210 at any of the three reference voltages, VHI, VMED and VLO.

Within the first circuit path 220, transistor 222 may connect the output terminal 210 to an intermediate supply voltage VMED. In addition, the gate of transistor 222 is supplied by control signal GP_L which may have a value of VHI, VMED, or VLO depending on the desired state of transistor 222. Similarly, the backgate voltage of transistor 222 may also be controlled by applying VHI or VMED to the backgate.

The second circuit path 230 includes a pair of transistors 232, 234 that may connect the output terminal 210 a high supply voltage VHI. The gate of transistor 232 is supplied by control signal GPH which may have a value of VHI or VMED depending on the desired state of transistor 232. Similarly, the gate of transistor 234 may be controlled by applying VMED to its gate node.

The third circuit 240 path may connect the output terminal 210 to a low supply voltage VLO (shown as ground) by another pair of transistors 242, 244. In addition, the gate of transistor 244 is supplied by control signal GPN which may have a value of VMED or VLO depending on the desired state of transistor 242. Similarly, the gate of transistor 242 may be controlled by applying VMED to its gate node.

To drive VOUT to VLO, control signals may be applied to the circuit as follows: GPL may be set to VMED, BG may be set to VMED, GPH may be set to VHI and GNN may be set to VLO. In this configuration, the transistor 222 may be turned off. In addition, transistor 220 may be turned off. Moreover, the gate signal may place transistor 234 in a protection mode, which clamps the drain of transistor 220 to a value not lower than VMED. Thus, the transistor 220 should have a voltage established across its source and drain at a level that represents the difference of VHI and VMED, which should be within the transistor's voltage tolerance. Further, the NMOS transistors 240 and 250 may be turned on and connect the output terminal 210 to VLO. Transistors 242 and 244 are turned on by setting their respective gate voltages to intermediate voltage VMED. Accordingly, output voltage $V_{OUT}$ is driven to a low voltage level VLO and each of the transistors 222, 232, 234, 242, and 244 in the power stage experience voltages that are within the transistor's voltage tolerance.

To drive VOUT to high voltage VHI, control signals may be applied to the circuit as follows: GPL may be set to VHI, BG may be set to VHI, GPH may be set to VMED and GNN may be set to VLO. Transistor 222 may be turned off. To turn off transistor 222, its gate and backgate voltages are set to high voltage VHI. In addition, transistors 232 and 234 are turned on. Transistors 232 and 234 are turned on by setting each of their gate voltages to intermediate voltage VMED. Lastly, transistor 240 may be placed in a protection mode by setting its gate voltage to intermediate voltage VMED, which can clamp the drain of transistor 244 not higher than VMED. Transistor 244 may be turned off by setting its gate voltage to VLO. In this manner, output voltage VOUT is driven to a high voltage level VHI.

To drive VOUT to intermediate voltage PBAT, control signals may be applied to the circuit as follows: GPL may be set to VLO, BG may be set to VMED, GPH may be set to VHI and GNN may be set to VLO. Transistor 222 is turned on. To turn on transistor 222, its gate voltage is set to VLO and its backgate voltage is set to intermediate voltage VMED. Transistors 232 and 234 are turned off. For example, transistor 232 is turned off by setting the gate voltage to high voltage VHI, and transistor 234 is turned off by setting its gate voltage to an intermediate voltage VMED. Lastly, transistors 242 and 244 are turned off. For example, transistor 242 is turned off by setting its gate voltage to intermediate voltage VMED, and transistor 244 is turned off by setting its gate voltage to VLO. Accordingly, output voltage VOUT is driven to an intermediate voltage level VMED.

By applying embodiments of the invention supply multiple or multi-level output voltages, including voltages that exceed that breakdown voltages of the transistors. As a result, higher voltages (e.g., 6~8V) may be supplied when a lower voltage (i.e., VHI of 5V is supplied). In addition, none of the transistors are subject to a voltage that exceeds its breakdown voltage (e.g., 5V).

In some instances, transistors 222, 232 and 234 may be PMOS transistors, and transistors 242 and 244 may be NMOS transistors. However, other configurations are possible. For example, 222, 232 and 234 may be NMOS transistors, and transistors 242 and 244 may be PMOS transistors. In this example, the high voltage supply may be coupled to third switching path 240, and the low voltage supply VLO (shown as ground) may be supplied to second switching path 230.

Figure 3:
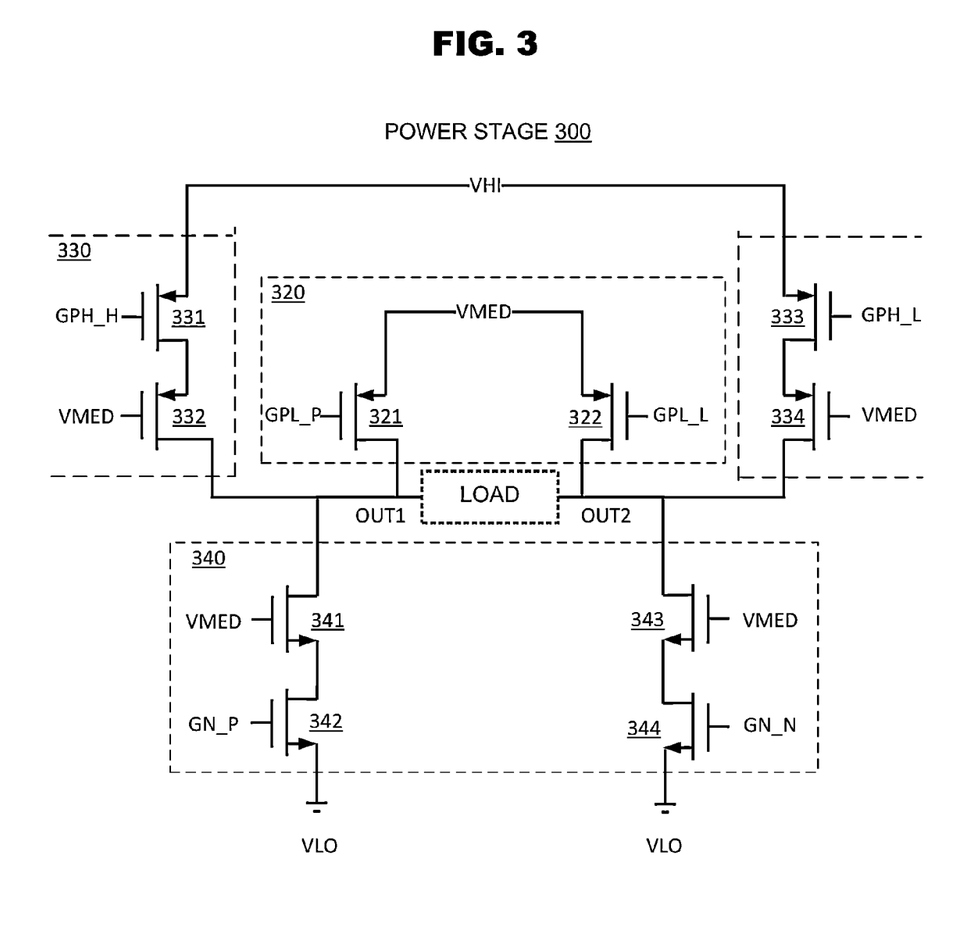
FIG. 3 illustrates a power stage according to an example embodiment of the present invention.

FIG. 3 illustrates a circuit schematic of a power stage 300 according to another embodiment of the present invention. The power stage 300 may include a pair of power stage circuits as in the FIG. 2 embodiment, each with their own output terminals OUT1, OUT2 connected to respective terminals of a load device LOAD.

The power stage 300 may include output terminals OUT1, OUT2 connected to supply voltages to a load device LOAD by three different circuit paths 320, 330 and 340. A first circuit path 320 connects the output terminal to an intermediate supply voltage VMED by a pair of transistors 321 and 322. A second circuit path 330 may connect the load device to a high supply voltage VHI by either of transistor pairs 331, 332 or 333, 334. A third circuit 340 path may connect the load device to a low supply voltage VLO (shown as ground) by another either of transistor pairs 341, 342 or 343, 344. The power stage may be controlled to generate an output voltage on the output terminals OUT1, OUT2 connected to the load device at any of the three reference voltages, VHI, VMED and ground.

The example power stage 300 may include a plurality of PMOS switching elements 321, 322, and 331-334 and a plurality of NMOS switching elements 341-344 arranged in an H-bridge configuration. In this example configuration, each side of the H-bridge includes three PMOS transistors 321, 331, and 332, as well as 322, 333, and 334, respectively. On each side of the H-bridge arrangement, one PMOS transistor 310, 311 is coupled to intermediate voltage VMED, and two PMOS transistors 320 and 330 are coupled to high voltage VHI. In addition, each side of the H-bridge is also coupled to ground through two NMOS transistor 341, 342 and 343, 344, respectively. Alternatively, transistors 321, 322, and 331-334 may be NMOS switching elements and transistors 341, 342 and 343, 344 may be PMOS switching elements. In this alternative, the high voltage supply may be coupled to third switching path 340, and the low voltage supply VLO (shown as ground) may be supplied to second switching path 330.

Figure 4:
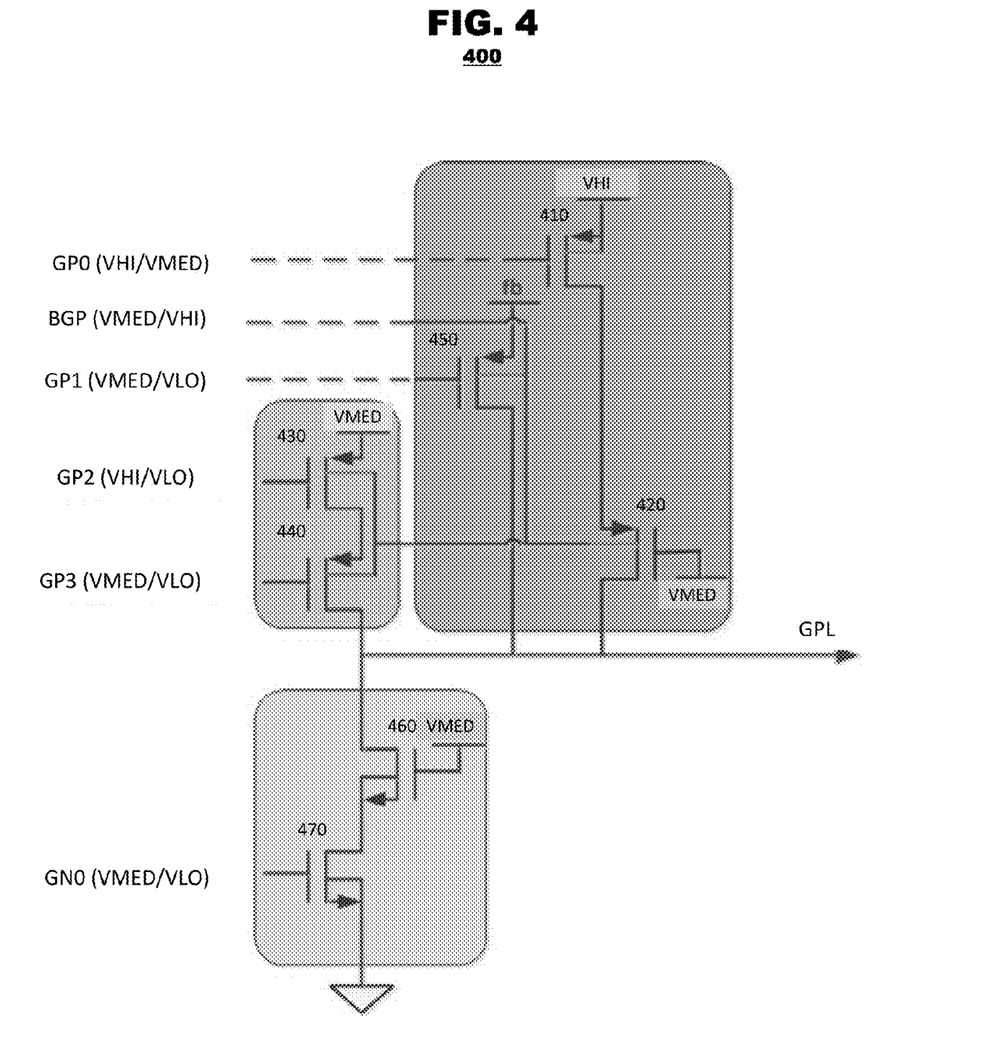
FIG. 4 illustrates a gate driver according to an example embodiment of the present invention.

FIG. 4 illustrates a gate driver 400 according to an example embodiment of the present invention. The gate driver 400 includes a plurality of PMOS transistors 410-450 coupled to a plurality of driving signals GP0-GP3 and BGP. The gate driver 400 also includes a plurality of NMOS transistors 460-470 coupled to driving signal GN0.

Transistors 410 and 420 are disposed between high voltage VHI and gate driver output GPL. The gate of transistor 410 is controlled by driving signal GP0, wherein the gate driving signal GP0 may have a high voltage VHI or intermediate voltage VMED level. The gate of transistor 420 is coupled to intermediate voltage VMED. Transistors 430 and 440 are disposed between intermediate voltage VMED and gate driver output GPL. The gate of transistor 430 is controlled by driving signal GP2, wherein the gate driving signal GP2 may have a high voltage VHI or VLO (e.g., ground) voltage level. The gate of transistor 440 is controlled by driving signal GP3, wherein the gate driving signal GP3 may have an intermediate voltage VMED or VLO (e.g., ground) level voltage. In addition a backgate driving signal BGP is supplied to the backgates of each of transistors 420, 430, and 440. Transistor 450 is disposed between voltage VOUT and gate driver output GPL. The gate of transistor 450 is set to intermediate voltage VMED.

The gate driver output GPL is coupled to two NMOS transistors 460 and 470, which are connected in series to a ground node. The gate of transistor 460 coupled to intermediate voltage VMED. The gate of transistor 470 is driven by driving signal GN0, wherein the gate driving signal GP0 may have an intermediate voltage VMED or low voltage level VLO.

To drive the gate driver output GPL from VLO to intermediate voltage VMED, the driving signals may be set as follows: GP0 is set to VHI, GP1 is set to VMED, GP2 is set to VLO, GP3 is set to VMED and then to VLO, GN0 is set to VMED and then to VLO, and BGP is set to VMED. To drive the gate driver output GPL from VLO to high voltage VHI, the driving signals may be set as follows: GP0 is set to VHI and then to VMED, GP1 is set to VMED, GP2 is set to VHI, GP3 is set to VMED, GN0 is set to VMED and then to VLO, BGP is set to VMED and then to VHI.

In some instances, usually in an abnormal case, the gate driver output GPL is driven from intermediate voltage VMED to high voltage VHI. For example, this may occur when the output of the class D amplifier is short. To drive the gate driver output GPL from intermediate voltage VMED to high voltage VHI, the driving signals may be set as follows: GP0 is set to VHI and then to VMED, GP1 is set to VMED, GP2 is set to VLO and then to VHI, GP3 is set to VLO and then to VMED, GN0 is set to VLO, and BGP is set to VHI.

Except unusual cases (e.g., when the output of the class D amplifier is short), the output voltage $V_{OUT}$ of power stage 100 will not switch from a VLO voltage to a high voltage VHI directly. Accordingly, gate driver output GPL switches between VLO and VMED (i.e., VOUT switches between VMED and VLO) or GPL switches between low VLO and high voltage level VHI (i.e., VOUT switches between VMED and VHI). In the first case, the driver path between GPL and high voltage VHI is turned off. In the second case, the path between GPL and intermediate voltage VMED is turned off.

Figure 5:
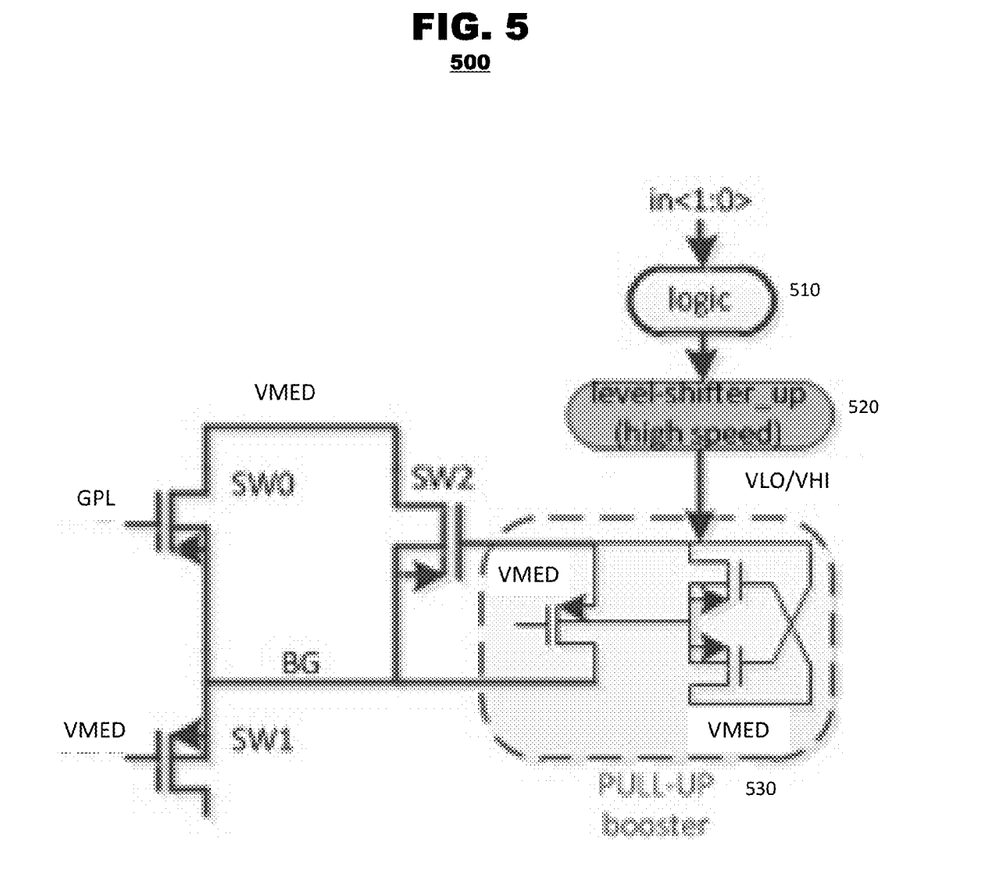
FIG. 5 illustrates a backgate controller according to an example embodiment of the present invention.

FIG. 5 illustrates a backgate controller 500 according to an example embodiment of the present invention. The backgate controller 500 includes PMOS switches transistors SW0-SW2, logic 510, level shifter 520, and pull-up booster 530.

As shown in FIG. 5, transistors SW0 and SW2 are placed between VMED and back-gate (BG). SW1 is placed between VOUT and BG. The gate of transistor SW0 is controlled by gate driver output GPL, and the gate of transistor SW1 is set to VMED. The gate of transistor SW2 is controlled by high speed level-shifter 520, which supplies either a low voltage VLO or high voltage VHI signal. When high speed level-shifter output switch from VLO to VHI, pull-up booster 530 works to increase its rising speed further.

When a low level input signal is supplied to logic circuit 510, the output of level shifter 520 is set to VLO. By contrast, when a high level input signal is supplied to logic circuit 510, the output of level shifter 520 is set to high voltage VHI. When a middle level signal is supplied to logic circuit 510, the output of level shifter 520 does not change. Transistor SW2 is turned on when the output of level-shifter 520 is VLO.

As described above, the backgate controller can be implemented using three PMOS transistors SW0-SW2. In an example embodiment, the size of transistor SW2 can be significantly larger than either of transistors SW0 and SW1. Transistor SW2 can be adapted to reduce power loss during the dead-time when the output voltage $V_{OUT}$ is switched between VLO and intermediate voltage VMED. In this case, it is possible that the current is from VOUT to VMED and goes through SW2, which will introduce power loss. The other two transistors SW0 and SW1 can be implemented by smaller size switches because no high current will go through them. The relative sizes of transistors SW0-SW2 will also be discussed in connection with FIG. 4. SW1 can turn on and pull up BG automatically if output voltage $V_{OUT}$ increases to a level higher than VMED. Transistor SW0 can turn on when GPL=GND (i.e., when output voltage $V_{OUT}$ is driven to VMED).

As discussed above, for example in connection with FIGS. 2 and 4, the backgate controller 500 drives the backgate drive signal to intermediate voltage VMED or high voltage VHI. When backgate voltage BG is set to intermediate voltage VMED and gate driver output GPL is set to VLO, output voltage VOUT is set to intermediate voltage VMED. Here, transistor SW0 is turned on. Otherwise, VOUT is set to low voltage level VLO or high voltage VHI. Specifically, when backgate voltage BG and gate driver output GPL are both set to intermediate voltage VMED, output voltage VOUT is driven to VLO. Here, transistor SW2 is turned on. Similarly, when backgate voltage BG and gate driver output GPL are both set to high voltage VHI, output voltage $V_{OUT}$ is driven high voltage VHI. Here, transistor SW1 is turned on.

Figure 6:
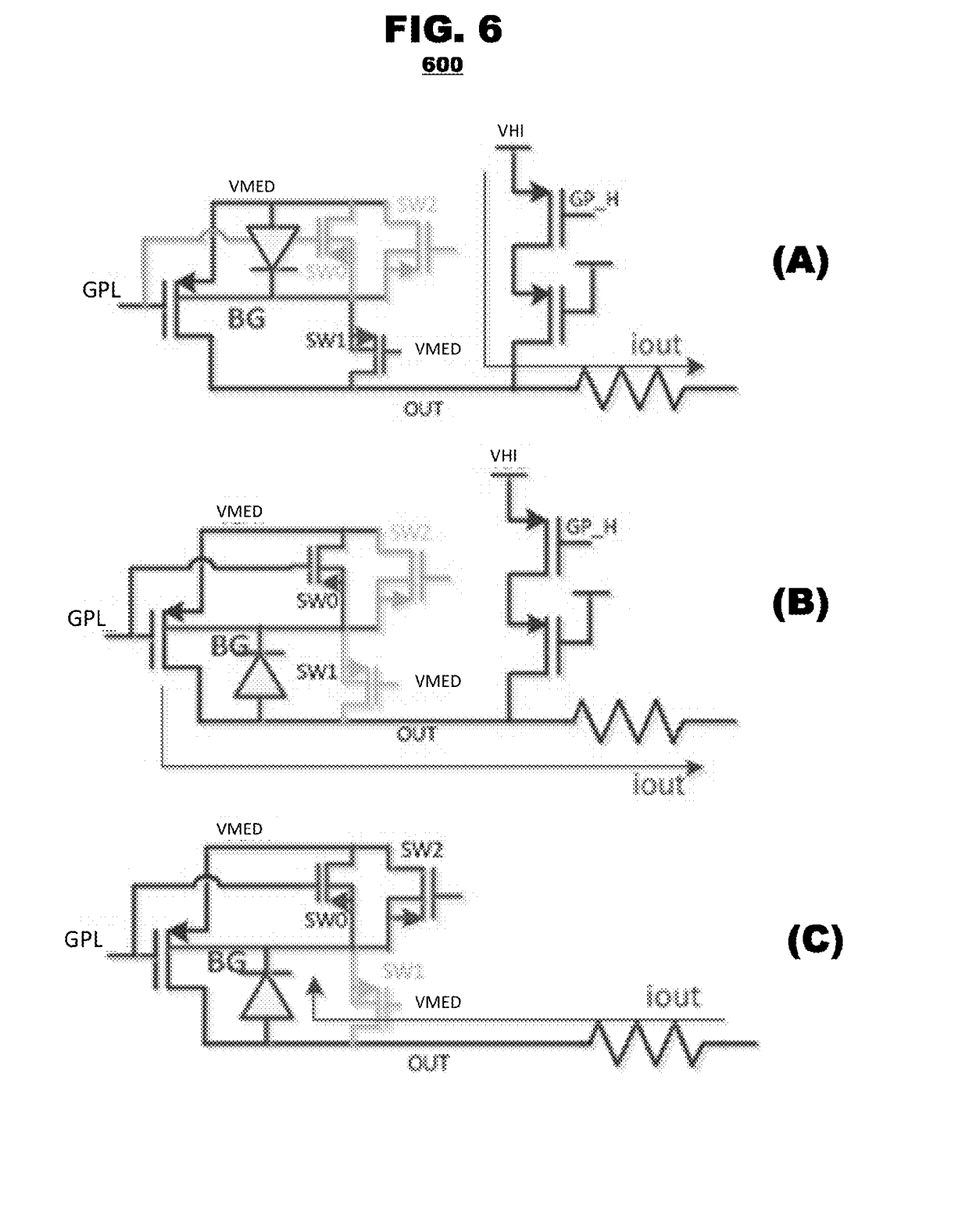
FIG. 6 illustrates a backgate controller according to another example embodiment of the present invention.

FIG. 6 illustrates a backgate controller 600 according to another example embodiment of the present invention.

As shown in 6(A), when transistor SW1 is turned on, the backgate voltage BG equals the output voltage VOUT. Here, the parasitic diode is negative biased. Since high current does not flow through transistor SW1, the transistor can be implemented with a smaller size device.

Next, as shown in 6(B), when only SW0 is turned on, output voltage VOUT is switched from high voltage VHI to intermediate voltage VMED. Here, the backgate voltage is an intermediate voltage VMED. Again, since high current does not flow through transistor SW0, the transistor can also be implemented using a smaller size device.

Lastly, as shown in FIG. 6(C), when transistor SW2 is turned on, the output voltage $V_{OUT}$ switches between VLO and an intermediate voltage VMED. Here, the backgate voltage is driven to intermediate voltage VMED. In this case, current may flow from the output node to the intermediate voltage node through transistor SW2. Accordingly, transistor SW2 can be implemented with a switch larger than SW0 and SW1.

By implementing the embodiments described herein, the voltage spikes introduced between output voltage VOUT and ground are reduced. In particular, the embodiments of the present invention reduce voltage spikes on each cascade transistor by up to 50%. In addition, no extra drivers are needed for the cascode devices, and die size can be reduced. Thus, the configuration of the driver circuit is simplified. In addition, the power stage can output three levels, which can reduce system power loss and improve the SNR and EMI performance.

With respect to Class D amplifier applications, the efficiency of the boosted Class D amplifier is substantially improved. By replacing traditional power stage in BCD process with this cascode configuration in 5V process, cost can also be dramatically reduced.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

For example, the circuits illustrated in the foregoing discussion find convenient application in battery-powered circuit application and, therefore, the discussion has presented the reference voltages in the context of a battery supply, labeled VMED. The principles of the present invention are not so limited, however, and these circuits also may be applied in circuit applications that receive supply voltages from non-battery powered sources (e.g., line power).

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings and specification.

The invention claimed is:

1. A power stage to generate an output voltage at one of a high reference voltage, an intermediate reference voltage and a low reference voltage, comprising:
    a first switch stage connecting the output terminal to the high reference voltage, comprising a pair of transistors connected in series along their source-to-drain paths, a first transistor coupled to the output terminal and having its gate biased at the intermediate voltage, a second transistor having a gate that receives a first stage control signal that varies between the high reference voltage and the intermediate reference voltage,
    a second switch stage connecting the output terminal to the intermediate reference voltage, having a gate that receives a second stage control signal that varies among the high reference voltage, intermediate reference voltage and low reference voltage;
    a third switch stage connecting the output terminal to the low reference voltage, having a pair of transistors connected in series along their source-to-drain paths, a first transistor coupled to the output terminal and having its gate biased at the intermediate voltage, a second transistor having a gate that receives a third stage control signal that varies between the intermediate reference voltage and the low reference voltage wherein the third switch stage provides a protective mode when at least one of the pair transistors is off.

2. The power stage of claim 1, wherein the transistors have a breakdown voltage that is lower than a difference between the high reference voltage and the low reference voltage.

3. A power stage to generate an output voltage at one of a first reference voltage, an second reference voltage and a third reference voltage, comprising:
    a first switch stage connecting the output terminal to the first reference voltage, comprising a pair of transistors connected in series along their source-to-drain paths, a first transistor coupled to the output terminal and having its gate biased at the second voltage, a second transistor having a gate that receives a first stage control signal that varies between the first reference voltage and the second reference voltage,
    a second switch stage connecting the output terminal to the second reference voltage, having a gate that receives a second stage control signal that varies among the first reference voltage, second reference voltage and third reference voltage;
    a third switch stage connecting the output terminal to the third reference voltage, having a pair of transistors connected in series along their source-to-drain paths, a first transistor coupled to the output terminal and having its gate biased at the second voltage, a second transistor having a gate that receives a third stage control signal that varies between the second reference voltage and the third reference voltage, wherein the third switch stage provides a protective mode when at least one of the pair transistors is off.

4. The power stage of claim 1, wherein the transistors have a breakdown voltage that is lower than a difference between the first reference voltage and the third reference voltage.

5. An amplifier system, comprising:
    a power stage having inputs for at least two supply voltages and an output voltage node for coupling to a load, the power stage including:
    a first plurality of transistors, at least one of the first plurality of transistors being disposed between an intermediate voltage node and the output voltage node, and at least two of the first plurality of transistors being connected in series and disposed between a high voltage node and the output voltage node;
    a second plurality of transistors being connected in a cascode configuration and disposed between the output voltage node and a low voltage node, wherein the cascode configuration provides a protective mode when at least one of the transistors of the second plurality is off; and
    a driver to generate control signals to the power stage that causes the power stage to vary an output voltage applied to the load from among the at least three voltage levels.

6. The amplifier system of claim 5, wherein the first plurality of transistors includes PMOS transistors.

7. The amplifier system of claim 5, wherein the second plurality of transistors includes NMOS transistors.

8. The amplifier system of claim 5, wherein the output node is adapted to output high, intermediate, and low voltage levels.

9. The amplifier system of claim 5, further comprising a backgate controller to generate control signals to at least one of the first plurality of transistors.

10. A method, comprising:
generating an output voltage to a load, by a power stage having inputs for at least two supply voltages, the power stage including:
a first plurality of transistors, at least one of the first plurality of transistors being disposed between an intermediate voltage node and an output voltage node, and at least two of the first plurality of transistors being connected in series and disposed between a high voltage node and the output voltage node;
a second plurality of transistors being connected in a cascode configuration and disposed between the output voltage node and a low voltage node, wherein the cascode configuration provides a protective mode when at least one of the transistors of the second plurality is off; and
generating control signals to the power stage, by a controller, to cause the power stage to vary the output voltage applied to the load from among more three voltage levels.

11. The method of claim 10, wherein the first plurality of transistors includes PMOS transistors.

12. The method of claim 10, wherein the second plurality of transistors includes NMOS transistors.

13. The method of claim 10, wherein the output node is adapted to output high, intermediate, and low voltage levels.

14. The method of claim 10, further comprising generating backgate control signals to at least one of the first plurality of transistors.

15. A multi-level output power stage, comprising:
inputs for at least two supply voltages;
an output voltage node for coupling to a load;
a first plurality of transistors, at least one of the first plurality of transistors being disposed between an intermediate voltage node and the output voltage node, and at least two of the first plurality of transistors being connected in series and disposed between a high voltage node and the output voltage node; and
a second plurality of transistors being connected in a cascode configuration and disposed between the output voltage node and a low voltage node, wherein the cascode configuration provides a protective mode when at least one of the transistors of the second plurality is off.

16. The multi-level output cascade power stage of claim 15, further comprising a driver to generate control signals to the power stage that causes the power stage to vary an output voltage applied to the load from among the at least three voltage levels.

17. The multi-level output cascade power stage of claim 15, wherein the first plurality of transistors includes PMOS transistors.

18. The multi-level output cascade power stage of claim 15, wherein the second plurality of transistors includes NMOS transistors.

19. The multi-level output cascade power stage of claim 15, wherein the output node is adapted to output high, intermediate, and low voltage levels.

20. The multi-level output cascade power stage of claim 15, further comprising a backgate controller to generate control signals to at least one of the first plurality of transistors.

* * * * *

UNITED STATES PATENT AND TRADEMARK OFFICE
CERTIFICATE OF CORRECTION

PATENT NO. : 9,960,760 B2
APPLICATION NO. : 14/063636
DATED : May 1, 2018
INVENTOR(S) : Dan Li

Page 1 of 1

It is certified that error appears in the above-identified patent and that said Letters Patent is hereby corrected as shown below:

In the Claims

In Column 7, Line 65, in Claim 1, after "voltage", insert --,--

Signed and Sealed this
Eleventh Day of June, 2019

Andrei Iancu
*Director of the United States Patent and Trademark Office*